(12) United States Patent
Rao

(10) Patent No.: US 11,837,254 B2
(45) Date of Patent: Dec. 5, 2023

(54) FRONTEND CAPTURE WITH INPUT STAGE, SUPPRESSION MODULE, AND OUTPUT STAGE

(71) Applicant: Zoom Video Communications, Inc., San Jose, CA (US)

(72) Inventor: Yu Rao, Sunnyvale, CA (US)

(73) Assignee: Zoom Video Communications, Inc., San Jose, CA (US)

( * ) Notice: Subject to any disclaimer, the term of this patent is extended or adjusted under 35 U.S.C. 154(b) by 118 days.

(21) Appl. No.: 17/503,263

(22) Filed: Oct. 15, 2021

(65) Prior Publication Data

US 2023/0041098 A1 Feb. 9, 2023

Related U.S. Application Data

(60) Provisional application No. 63/229,070, filed on Aug. 3, 2021.

(51) Int. Cl.
*G10L 25/84* (2013.01)
*G10L 21/0272* (2013.01)
*H04L 65/403* (2022.01)

(52) U.S. Cl.
CPC .......... *G10L 25/84* (2013.01); *G10L 21/0272* (2013.01); *H04L 65/403* (2013.01)

(58) Field of Classification Search
CPC ..... G10L 25/84; G10L 21/0272; G10L 25/78; G10L 21/0208; G10L 21/0232;

(Continued)

(56) References Cited

U.S. PATENT DOCUMENTS 11,164,592 B1 * 11/2021 Wu .................. G10L 21/034
2005/0152563 A1 * 7/2005 Amada ............. G10L 21/0208
381/94.1

(Continued)

FOREIGN PATENT DOCUMENTS

GB 2536729 A 9/2016

OTHER PUBLICATIONS

Cohen, Israel, et al . . . "Speech enhancement for non-stationary noise environments." Signal processing 81.11 (2001): 2403-2418 (Year: 2001).*

(Continued)

*Primary Examiner* — Andrew C Flanders
*Assistant Examiner* — Michael C. Lee
(74) *Attorney, Agent, or Firm* — Kilpatrick Townsend & Stockton LLP

(57) ABSTRACT

Disclosed are systems and methods for a frontend capture module of a video conferencing application, which can modify an input signal, received from a microphone device to match predetermined signal characteristics, such as voice signal level and expected noise floor. An Input stage, a suppression module and an output stage amplify the voice signal portion of the input signal and suppress the noise signal of input signal to predetermined ranges. The input stage selectively applies gains defined by a gain table, based on signal level of the input signal. The suppression module selectively applies a suppression gain to the input signal based on presence or absence of voice signal in the input signal. The output stage further amplifies the input signal in portions having a voice signal and applies a gain table to maintain a consistent noise floor.

20 Claims, 10 Drawing Sheets

(58) Field of Classification Search
CPC ......... G10L 2021/02168; H04L 65/403; H04L 65/764; H04L 65/80; H03G 3/32
See application file for complete search history.

(56) References Cited

U.S. PATENT DOCUMENTS

| | | | |
|---|---|---|---|
| 2008/0269926 A1 | 10/2008 | Xiang et al. | |
| 2009/0287496 A1 | 11/2009 | Thyssen et al. | |
| 2010/0303177 A1* | 12/2010 | Yang | H04L 25/0202 375/343 |
| 2011/0103615 A1* | 5/2011 | Sun | G10L 21/0208 381/94.1 |
| 2015/0205571 A1 | 7/2015 | Duwenhorst et al. | |
| 2015/0279386 A1* | 10/2015 | Skoglund | G10L 21/0208 704/226 |
| 2016/0240204 A1 | 8/2016 | Kuech et al. | |
| 2020/0099793 A1* | 3/2020 | Adams | H04M 9/087 |
| 2021/0158833 A1 | 5/2021 | Cooke | |
| 2021/0389925 A1* | 12/2021 | Adams | G10L 21/0364 |

OTHER PUBLICATIONS

Chowdhury, Md Foezur Rahman, et al. "A highly non-stationary noise tracking and compensation algorithm, with applications to speech enhancement and on-line ASR." 2012 IEEE International Conference on Acoustics, Speech and Signal Processing (ICASSP). (2012). pp. 4437-4340 (Year: 2012).*

Saki, Fatemeh, et al. "Automatic switching between noise classification and speech enhancement for hearing aid devices." 2016 38th Annual International Conference of the IEEE Engineering in Medicine and Biology Society (EMBC). (2016). pp. 736-739 (Year: 2016).*

PCT App. No. PCT/US2022/039205, "International Search Report and Written Opinion", dated Nov. 18, 2022, 13 pages.

* cited by examiner

800 ↘

802 Start

804 Receive input signal and determine signal level

806 Selectively apply gain/compression based on signal level

808 Selectively apply a compression factor, based on signal from VAD

810 Selectively apply gain/compression, based on signal level

812 End

FIG. 8

FRONTEND CAPTURE WITH INPUT STAGE, SUPPRESSION MODULE, AND OUTPUT STAGE

CROSS-REFERENCE TO RELATED APPLICATIONS

This application claims the benefit of priority of U.S. Provisional Application No. 63/229,070 filed on Aug. 3, 2021, entitled "FRONTEND CAPTURE," the content of which is incorporated herein by reference in its entirety and should be considered a part of this specification.

FIELD

This application relates to the field of audio processing during an audio or video conferencing session.

SUMMARY

The appended claims may serve as a summary of this application.

BRIEF DESCRIPTION OF THE DRAWINGS

FIG. 8 illustrates a flowchart of a method of an example operation of the FCM.

DETAILED DESCRIPTION OF THE DRAWINGS

Figure 1:
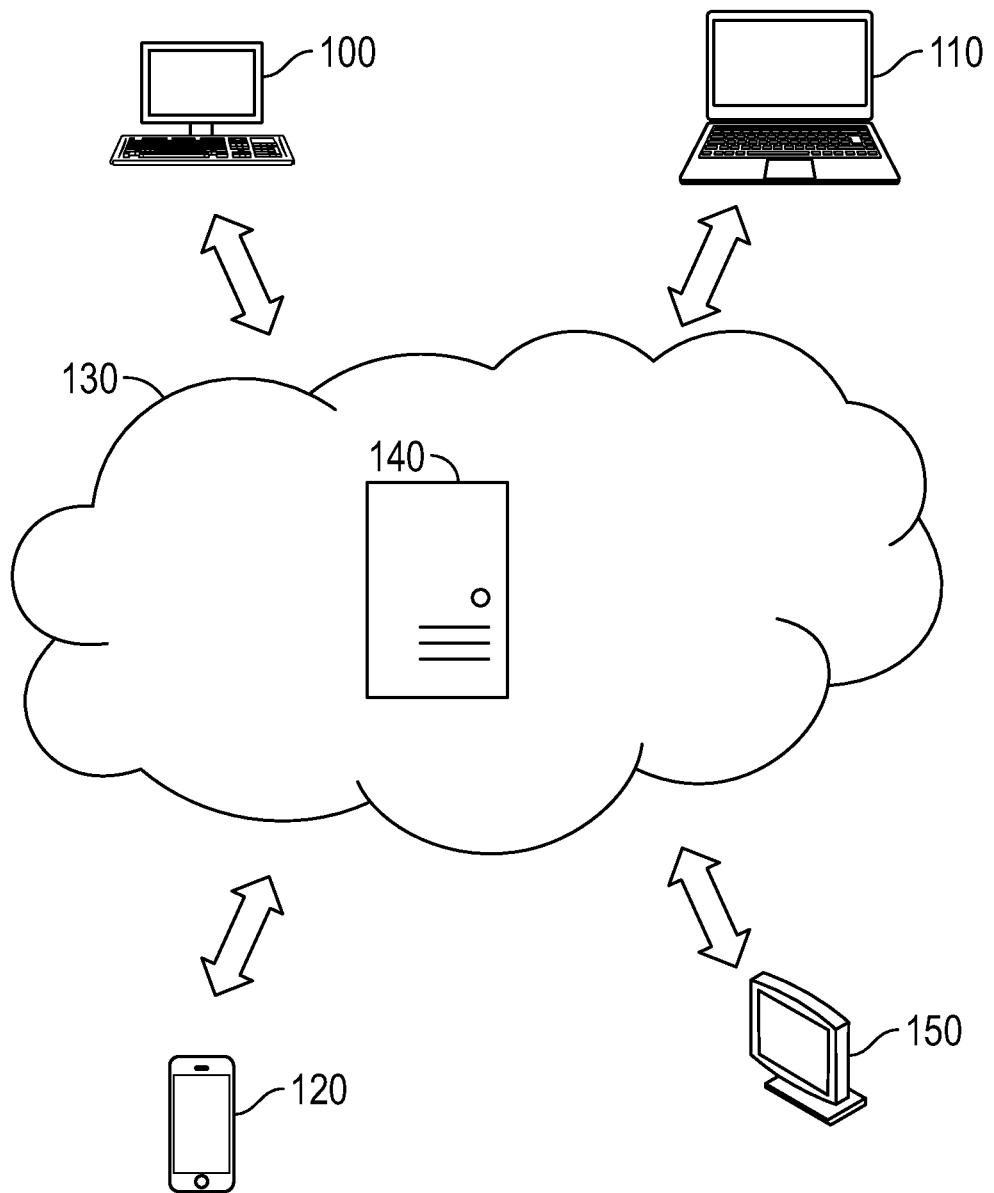
FIG. 1 illustrates a networked computer system with which an embodiment may be implemented.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Unless defined otherwise, all terms used herein have the same meaning as are commonly understood by one of skill in the art to which this invention belongs. All patents, patent applications and publications referred to throughout the disclosure herein are incorporated by reference in their entirety. In the event that there is a plurality of definitions for a term herein, those in this section prevail. When the terms "one", "a" or "an" are used in the disclosure, they mean "at least one" or "one or more", unless otherwise indicated.

Video conferencing over a computer network has existed and has increasingly played a significant role in the modern workplace. With the advent of remote working and shelter-in-place mandates by various government agencies during the COVID-19 pandemic, the role of robust video conferencing systems have only become more critical. There are various components (local and remote) that work in unison to implement a video conferencing system. Typical video conferencing applications include a client-side video conferencing application that can run on a desktop, laptop, smart phone or similar stationary or mobile computing device and can capture video and audio signals and transmit the signals to a recipient or far end computer.

In addition to the devices listed above, hardware customized and improved for video conferencing applications, can also be used to provide a more seamless video conferencing experience to the users. Video conferencing devices (VCDs) can include components that enable the users to participate in a video conference. For example, they can include a screen, camera, microphone, loudspeaker, microprocessor, memory and other components, so they can provide video conferencing frontend hardware independently. In some instances, the VCDs can be manufactured with equipment optimized to provide better video conferencing experience as well as providing other functionality. For example, VCDs can function as a second monitor and be included with an improved-quality camera, microphone and/or audio equipment. In some cases, VCDs may be manufactured by third parties independent from the provider of the video conferencing services. In those cases, the video conferencing provider can optimize or tailor its systems, for example, those responsible for capturing frontend input signal to obtain or process a frontend signal based on the features of the third party VCDs and their specifications.

Example Environment of a Video Conferencing Application

FIG. 1 illustrates a networked computer system with which an embodiment may be implemented. In one approach, a server computer 140 is coupled to a network 130, which is also coupled to client computers 100, 110, 120. For purposes of illustrating a clear example, FIG. 1 shows a limited number of elements, but in practical embodiments there may be any number of the elements shown in FIG. 1. For example, the server computer 140 may represent an instance of a server computer running one or more application servers among a large plurality of instances of application servers in a data center, cloud computing environment, or other mass computing environment. There also may be hundreds, thousands, or millions of client computers.

In an embodiment, the server computer 140 hosts a video conferencing meeting, transmits, and receives video, image, and audio data to and from each of the client computers 100, 110, 120.

Each of the client computers 100, 110, 120 can be a computing device having a central processing unit (CPU), graphics processing unit (GPU), one or more buses, memory organized as volatile and/or nonvolatile storage, one or more data input devices, I/O interfaces, and output devices such as loudspeakers, headphones, headsets, and LINE-OUT jack and associated software drivers. Each of the client computers 100, 110, 120 may include an integrated or separate display unit such as a computer screen, touch screen, TV screen or other display. Client computers 100, 110, 120 may comprise any of mobile or stationary computers including desktop computers, laptops, netbooks, ultrabooks, tablet computers, smartphones, etc. The GPU and CPU can each manage separate hardware memory spaces. For example, CPU memory may be used primarily for storing program instructions and data associated with application programs, whereas GPU memory may have a high-speed bus connection to the GPU and may be directly mapped to row/column drivers or driver circuits associated with a liquid crystal display (LCD), organic light emitting diode (OLED) or other display technology that serves as the display. In one embodiment, the network 130 is the Internet.

Each of the client computers 100, 110, 120 hosts, in an embodiment, a video conferencing application that allows each of the client computers 100, 110, 120 to communicate with the server computer 140. In an embodiment, the server computer 140 may maintain a plurality of user accounts, each associated with one of the client computers 100, 110, 120 and/or one or more users of the client computers.

Among other functions, the video conferencing application running on client computers can capture audio and transmit it to the server computer 140. The audio signal is generally captured having a variety of characteristics and parameters. The audio signal captured by the client device is converted into a digital audio signal, which can have a signal level. "Level" in an audio signal can be equivalent to an audio signal volume as perceived by a human. Digital signal level also relates to another characteristic of an audio signal called gain. Gain can refer to an amount of signal level added to or subtracted from an audio signal. Signal level, gain, and similar terminology, in this context can be expressed in units of decibel (dB). A related concept is dBov, or dBO, otherwise known as dB overload and can refer to a signal level or gain level, usually audio, that a device can handle before clipping occurs.

Another client computer can be a VCD 150. The video conferencing application running on the VCD 150 (and other client computers 100, 110, 120) can include a frontend capture module, which can receive an incoming audio signal, for example from a microphone of the client devices 100, 110, 120 and 150, as part of the video conferencing application functionality. The processing associated with the frontend capture module can be performed locally and/or remotely.

Typically, a video conferencing provider may design its infrastructure with a set of signal characteristics expectations, or specifications. These can include signal levels, noise levels, noise floor and other characteristics. These expectations may not always match with the hardware specifications of the client computers and third-party VCDs. For example, the server 140 may expect a voice signal level of −23 dB captured from the client device's microphone, while a VCD might provide a signal level that is lower than the expected threshold. For example, a third party VCD may provide a microphone signal having signal level of −40, −45, −50 dB, while the server 140 may expect a minimum signal level of −23 dB. The client device may provide a signal that is out of range of the specification of the server 140 due to a variety of factors, including for example, limitation in its hardware. For example, some VCD clients may have weak microphones that provide a low signal level below an expected minimum signal level threshold. In these instances, a frontend capture module may need to adjust the incoming signal characteristics at the frontend to meet the specification of the server 140, before routing the signal upstream.

Figure 2:
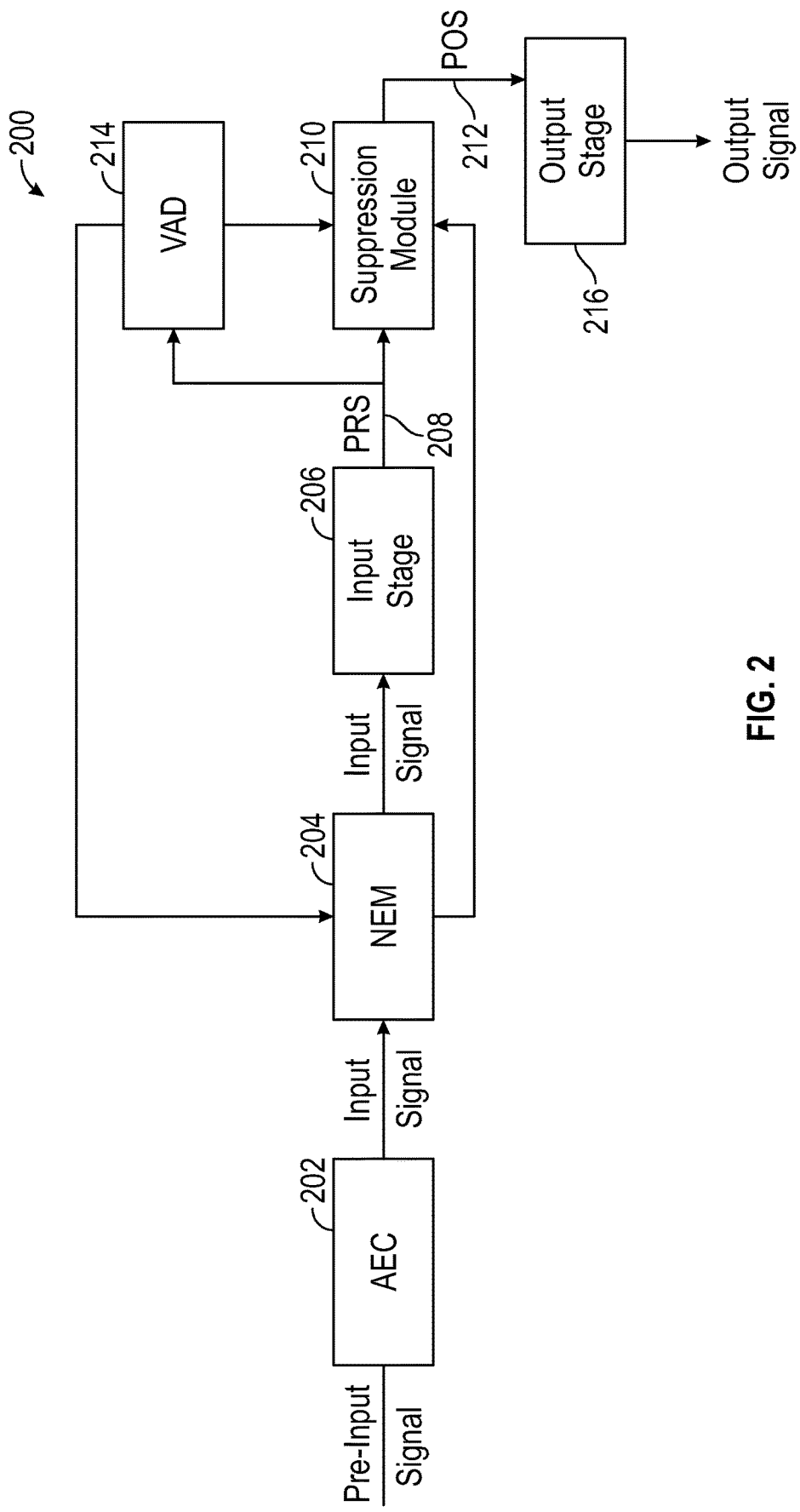
FIG. 2 illustrates an example frontend capture module (FCM), which can be implemented via a video conferencing application.

FIG. 2 illustrates an example frontend capture module (FCM) 200, which can be implemented via the video conferencing application. The FCM 200, as part of the video conferencing application, can be installed on a client device, such as a VCD 150. The VCD 150 may have a weak microphone capture and output. The FCM 200 can be configured to receive the weak microphone output and modify the microphone output to match the requirements and specification of the video conferencing application, before the audio signal is transmitted upstream.

The microphone of a VCD 150 can capture audio at a video conferencing session and generate a pre-input signal, which is received by the FCM 200. The pre-input signal may be in digital format, where the microphone or another independent module converts an analog signal received from the microphone to a digital audio signal. Alternatively, the analog to digital conversion may be performed by the FCM 200. In some VCDs, both microphone and loudspeaker components are present in the same location, causing undesirable audio effects, such as an echo. The FCM 200 can include an acoustic echo cancelation (AEC) module 202, which can eliminate undesirable audio effects, such as echo. While AEC is shown, as an example, other pre-processing modules can also be implemented, as envisioned by persons of ordinary skill in the art, to prepare the pre-input signal for the operations of the FCM 200. The AEC module 202 or other preprocessing modules receive the pre-input audio signal from a microphone or an analog to digital converter and generate an input signal.

In some embodiments, a noise estimation module (NEM) 204 can receive the input signal and generate an estimate of the noise level in the input signal. The estimated noise level in the input signal may alternatively be termed the estimated noise floor or the noise floor. The noise floor is used in the operations of the FCM 200. The input signal is further received by an input stage 206. The input stage 206 provides an amplification of the input signal, as well as compression for loud signals. The input stage 206 generates a pre-suppression signal (PRS) 208, which is received by a suppression module 210. The suppression module 210 can be configured to suppress the noise signal in the input signal, while maintaining the quality of the voice signal in the PRS 208.

The suppression module 210 can apply different compression factors, depending on whether the PRS 208 includes a voice signal or whether the PRS 208 lacks a voice signal. A voice activity detector (VAD) 214 can detect voice signals and lack of voice signals in the input signal and relay that information to the suppression module 210. The suppression module 210 generates a post-suppression signal (POS) 212, having selectively suppressed the PRS 208, based on whether voice activity is detected or not. The POS 212 is received by an output stage 216. The output stage 216 further amplifies the voice signal and lowers the noise floor to a consistent predetermined level, as will be described below. The output stage 216 receives the POS 212 and outputs an output signal. The output signal of the FCM 200 can be routed upstream by the video conferencing application for transmission to far end users and/or for further processing.

In one mode of operation of the FCM 200, the input stage 206 determines a signal level of the input signal and applies a selective gain, depending on the signal level of the input signal, generating a PRS 208. For example, the input stage 206 can apply an amplification gain to the input signals, having a low signal level and can apply a compression gain to the input signals having a high signal level. The suppression module 210 receives the PRS 208 and selectively applies a suppression gain, depending on whether the VAD 214 indicates a voice-on or voice-off status in the input signal (and by extension the PRS 208). For example, the suppression module 210 can apply a voice-on compression factor when the VAD 214 detects a voice signal in the input signal and apply a voice-off compression factor, when the VAD 214 detects no voice signal in the input signal. The suppression module 210 outputs a POS 212.

The output stage 216 can be configured to receive the POS 212 and generate the output signal, by selectively applying signal level gains to the POS 212. For example, the output stage 216 can apply no gain to portions of the POS 212 having a low signal level, such as those close to the noise floor or estimated noise floor in the input signal. The output stage 216 can apply a positive gain to portions of the POS 212 having medium signal levels, such as those found in a voice signal. Medium signal levels can alternatively be termed the soft signal. In some embodiments, the output stage 216 can apply a compression factor (or a gradually decreasing gain factor) to portions of the POS 212, having high signal levels. This can prevent, minimize or reduce clipping in the far end.

Figure 3:
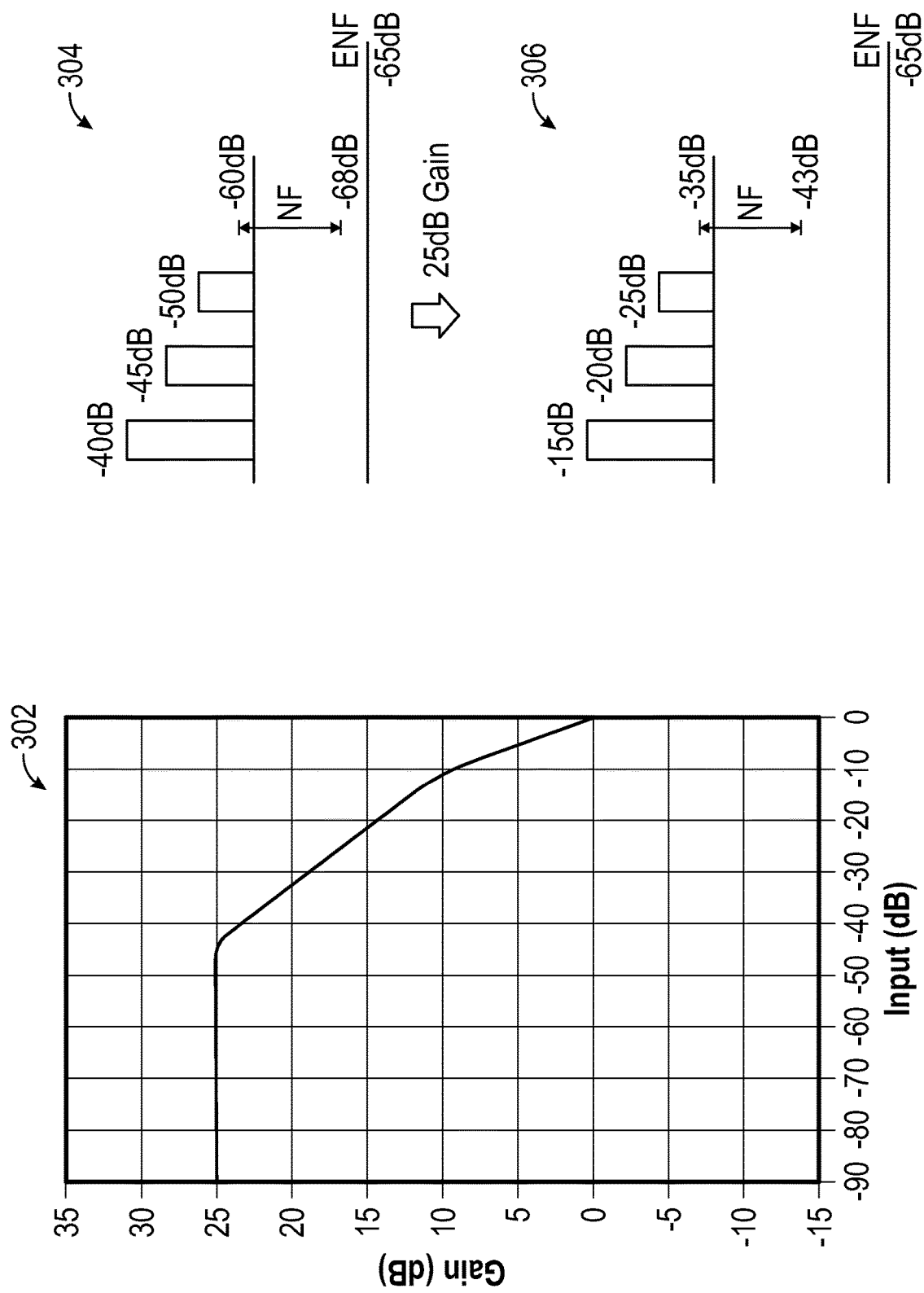
FIG. 3 illustrates diagrams of configuration and operation of an input stage 206 used in the FCM.

FIG. 3 illustrates diagrams of configuration and operation of the input stage 206. In some embodiments, the input stage 206 can be configured with a gain table illustrated as the graph 302. The horizontal axis in graph 302 is the signal level of the input signal in dB and the vertical axis is the amount of gain the input stage 206 applies to the input signal in dB. The gain in this context is an amount of signal level added to the input signal. The input stage 206 can detect signal level of the input signal and apply a corresponding gain from a gain table, for example, one illustrated in the graph 302. The graph 302 can configure the input stage 206 to amplify the input signals, having low signal levels and to compress the signals having high signal levels. Compression in this context can refer to gradually applying less gain, as the signal levels of the input signal rises, or applying a gradually decreasing gain for signals that are too loud. While not shown in the graph 302, a negative gain can be applied to signals above a predetermined threshold. In the example shown in the graph 302, the low-level signals below approximately −40 dB are amplified by a constant gain factor of 25 dB. Signals, having a signal level above −40 dB are gradually compressed according to corresponding gains in the gain table illustrated as graph 302. For example, a gain of only approximately 9 dB is applied to a −10 dB input signal. While not shown, a negative gain can be applied to input signals having signal levels above 0 dB to reduce the possibility of clipping. In some embodiments, the input stage 206 can be implemented using a dynamic range compression (DRC) hardware configured with a predetermined gain table. In the implementation shown in the graph 302, the gain table includes a constant amplification gain for input signals, having a signal level below a predetermined threshold. For example, input signals below −40 dB are amplified by a constant 25 dB gain.

The diagram 304 illustrates sample input signals −40 dB, −45 dB, and −50 dB. The range of noise floor (NF) for these input signal values is approximately between −68 dB to −60 dB. An example expected noise floor (ENF) for the video conferencing application might be −65 dB. Consequently, the range of noise floor for the input signals in the diagram 304 (−60 dB to −68 dB) is close enough to the expected noise floor (−65 dB) and acceptable. However, the input signals shown in the diagram 304 can be well below an expected voice signal level threshold (e.g., a −23 dB). The input signals shown in diagram 304 are below −40 dB, and the input stage 206 amplifies these input signals by 25 dB according to the gain table illustrated by the graph 302.

The diagram 306 illustrates example PRS 208 generated from the input signals shown in the diagram 304, when the input stage 206 amplifies the input signals shown in the diagram 304 by a corresponding gain from a gain table, such as the gain table illustrated by the graph 302. In this example, the input signals are amplified by a constant gain 25 dB.

In this example, an expected noise floor (ENF) is a parameter set by the video conferencing application and remains at or within a predetermined range (e.g., −65 dB in this example). The gain application of the input stage 206 can, in some cases, cause the amplified input signal noise floor to move away from the ENF. In the example shown, after amplification, the noise floor is in a range between −35 dB and −43 dB, which may be too far from the ENF for the efficient operations of the video conferencing application. As will be described, the FCM 200 can manipulate the input signal, such as those shown in the diagram 304 to achieve a consistent noise floor, close to or within an acceptable range of the ENF and to preserve or strengthen the voice signal portion of the input signal.

Figure 4:
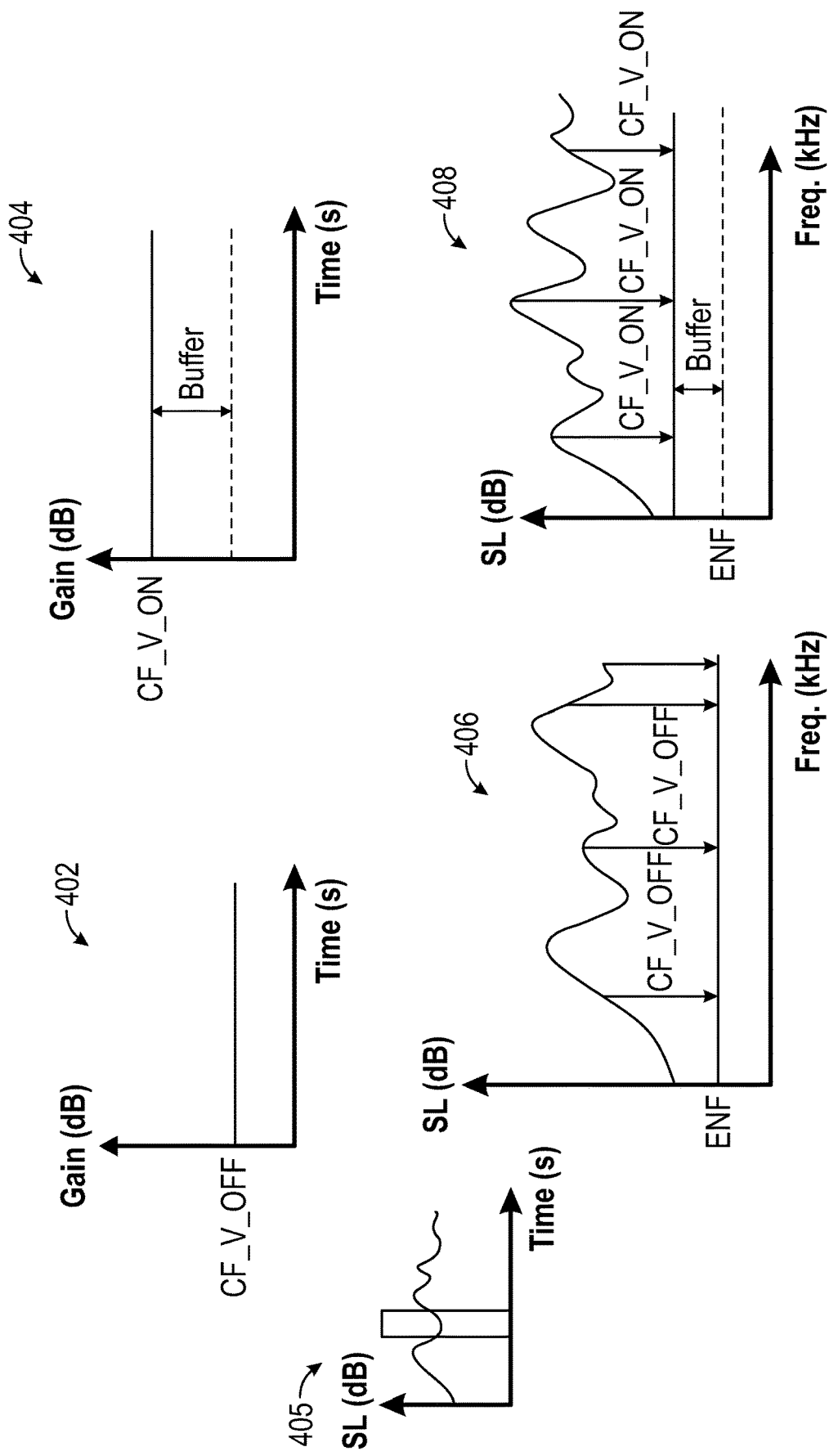
FIG. 4 illustrates gain and signal level graphs of the operation of a suppression module, used in the FCM.

FIG. 4 illustrates gain and signal level graphs of the operation of the suppression module 210. The suppression module 210 receives the PRS 208 and generates the POS 212 by selectively applying compression factors to the PRS 208, depending on whether or not the voice activity detector 214 indicates a voice signal or a lack of voice signal in the PRS 208. The graphs 402, 404 illustrate examples of the different compression values, the suppression module 210 can apply to the PRS 208. In the graphs 402, 404, gain in dB versus time in seconds (s) is plotted. In the graph 402, the VAD 214 indicates a lack of voice signal in the input signal. The suppression module 210 applies a compression_factor_voice_off (CF_V_OFF) to the PRS 208 during this period. In the graph 404, the VAD 214 indicates a voice signal in the input signal. The suppression module 210 applies a compression_factor_voice_on (CF_V_ON) to the PRS 208 during this period. The compression factors applied by the suppression module 210 can alternatively be termed suppression gains, and can be chosen, such that the PRS 208 is suppressed less aggressively during the period in which a voice signal in the input signal is detected. In other words, the CF_V_ON is smaller than CF_V_OFF by a predetermined amount of buffer. This allows the suppression module 210 to suppress the PRS 208 more aggressively when the input signal is mostly noise and less aggressively when in the input signal is mostly voice. An example amount of a predetermined buffer can be in the range of 5 to 15 dB. During a video conferencing session, a voice-off period can be a period when no speech is present at the location of the FCM 200, for example, when participants in that location are silent. The noise in these instances can be referred to as stationary noise, or noise floor and can originate from or be due to a variety of factors, such as a base level noise introduced by hardware (e.g., a microphone) or other stationary noise present in the location of the FCM 200 (e.g., a fan noise, traffic noise, distant chatter, or other background noise).

The graph 405 plots an example PRS 208 in time domain. On the horizontal axis, time in seconds is shown, and on the vertical axis, signal level (SL) in decibel (dB) is shown. The PRS 208 is divided into small window frames and converted to frequency domain, for example, by a Fast Fourier Transform (FFT) process. Examples of frequency domain representations of a window slice in time are shown in the graphs 406 and 408. In the graphs 406 and 408, the horizontal axis shows frequency in units of Kilo Hertz (kHz), and the vertical axis shows signal level in decibel (dB). The graphs 406 and 408 each show a different slice of the PRS 208, at different times. The graph 406 shows a frequency representation of a slice of the PRS 208 during a voice-off period. The voice-off period refers to a period in the input signal, where no voice signal in the input signal is detected. The graph 408 shows a frequency representation of a slice of the PRS 208 during a voice-on period. The voice-on period refers to a period in the input signal, where a voice signal in the input signal is detected.

In some embodiments, the compression factors, CF_V_OFF and CF_V_ON can be selected in relation to the expected noise floor (ENF). In the graph 406, the VAD 214 indicates a lack of voice signal in the input signal. The suppression module 210 applies a CF_V_OFF compression factor, where CF_V_OFF is selected to suppress the PRS 208 to a signal level at or near the ENF. In the graph 408, the VAD 214 indicates a voice signal in the input signal. The suppression module 210 applies a CF_V_ON compression factor, where CF_V_ON is selected to suppress the PRS 208 a predetermined amount of buffer above the ENF. Consequently, the suppression in the voice-on period is less aggressive, compared to the suppression during the voice-off period, allowing for more of the voice signal to be preserved. In some embodiments, the CF_V_ON can be chosen to be zero, thereby not applying any suppression to the PRS 208 when a voice-on period is detected. The selective application of suppression gain enables better preservation of the speech or voice signal in signals, having a low signal-to-noise ratio (SNR).

In some embodiments, the input signal noise floor is not known ahead of time, and as the participants in a video conferencing application speak, a noise floor, stationary noise level or a noise level can be estimated, using the noise estimation module 204. The noise estimation module 204 receives the input signal, estimates a noise level in the input signal and outputs the noise level. The estimated noise level (ENL) can be used in a variety of ways. For example, the compression factor, applied during the voice-off period, CF_V_OFF, can be chosen to be the difference between signal level and the ENL, plus the difference between the ENL and the expected noise floor (ENF). In this scenario, the PRS 208 is suppressed to a signal level at or near the ENF, during a voice-off period.

Figure 5:
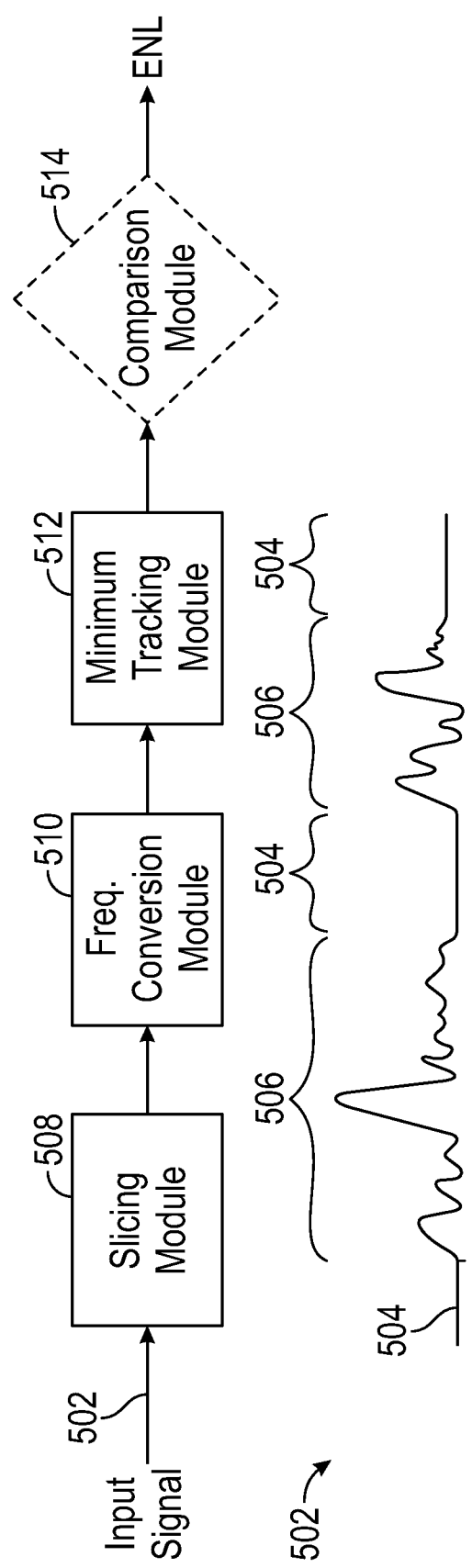
FIG. 5 illustrates an example diagram and example graphs of the operations of a noise estimation module (NEM), used in the FCM.
Figure 5:
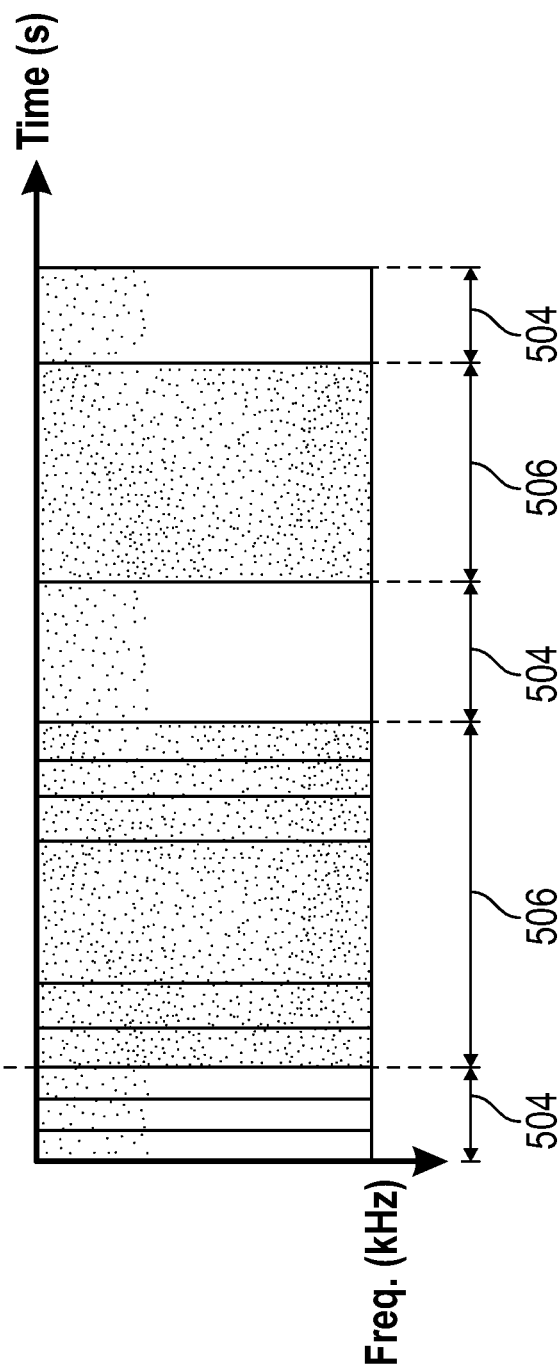

FIG. 5 illustrates an example diagram and example graphs of the operations of the noise estimation module (NEM) 204. The input signal 502 includes voice-off portions 504, indicated by flat portions in the graph of an example input signal 502. The input signal 502 includes voice-on portions 506 as well. The VAD 214 can determine the voice-on and voice-off portions of the input signal 502. The graph of input signal 502 is a plot of signal level values in decibel versus time in seconds. A frequency density graph of the input signal 502 is shown below the signal level graph. The horizontal axis is time in seconds and the vertical axis is frequency in kHz.

In some embodiments, the NEM 204 starts estimating a noise level in the input signal, when the VAD 214 sends a voice-off signal to the NEM 204. In some embodiments, the VAD 214 can detect a voice-off period in the PRS 208. In other embodiments, the VAD 214 may detect the voice-on and voice-off periods directly from the input signal. The NEM 204 slices the input signal into small windows of time, or frames, using a slicing module 508. The frames are converted into the frequency domain, using a frequency conversion module 510, generating frequency domain frames. The slicing module 508 and the frequency conversion module 510 may utilize FFT in some embodiments. A minimum tracking module 512 can establish a search window from a collection of frequency domain frames and search for local minimum frequencies in the frequency domain frames in the search window. The minimum tracking module 512 can compare the local minimums values to one another and determine a global minimum frequency in the search window. A signal level corresponding to the global minimum frequency can be used as an estimate of noise level in the input signal and outputted as an estimated noise level (ENL). In this scenario, the ENL is the signal level of an input signal 502 corresponding to the global minimum frequency.

In some embodiments, the search window may be established to include frames from a silent or voice-off period. Silent in this context refers to lack of voice signal, where noise signal may still be present. In some implementations of the NEM 204, frequencies in each frequency domain frame may be averaged, and the average value may be used as a local minimum frequency in a frequency domain frame. In some embodiments, power spectrum density (PSD) smoothing may be applied to the frequency domain frames before the operations of the minimum tracking module 512.

In some embodiments, the minimum tracking module 512 can establish a silent period search window, corresponding to a voice-off period and a voice period search window, corresponding to the voice-on period. The minimum tracking module 512 can determine a global minimum frequency in the silent period search window, as described above, and generate an ENL. When a period of voice-on is detected, for example by a signal from the VAD 214, the minimum tracking module 512 can establish a voice period search window made of frequency domain frames from the input signal having a voice signal. The minimum tacking module 512 can perform similar operations on the voice-period search window. For example, the minimum tracking module 512 can search for local minimums in the frequency domain frames in the voice-period search window and compare the local minimums to one another to determine a global minimum frequency in the voice-period search window. When the global minimum frequency in the voice-period search window is less than the global minimum frequency in the silent-period search window, the ENL can be updated to the value of a signal level corresponding to the global minimum frequency in the voice-period search window.

Updating the ENL in this manner is useful in circumstances where the global minimum frequency in the silent-period search window, for a variety of reasons, does not reflect a correct noise floor. For example, when an unexpected background noise pushes up the frequencies in the silent-period search window, while lower frequencies are encountered during the voice period search window, the NEM 204 can use a lower ENL, based on the global minimum frequency in the voice-period search window. In some embodiments, an optional comparison module 514 can compare the global minimum frequencies obtained from a voice-period search window to the global minimum frequency, obtained from a previous silent-period search window, and update the ENL if the global minimum frequency in the voice-period search window is a lower value than the global minimum frequency in the silent-period search window.

The suppression module 210 can use the ENL to generate the voice-off compression factor applied when no voice signal is detected. For example, in some implementations, the voice-off compression factor is generated, at least in part, based on a signal level difference between the PRS 208 during a voice-off period and the ENL in the input signal. In some embodiments, the voice-off compression factor is equal to the difference in PRS 208 signal level and the ENL in the input signal, plus the difference between the ENL and the expected noise floor (ENF). This is to increase the likelihood that the noise floor of the POS 212 can reach a predetermined ENF. Other parameters and circumstances can also relate to the amount of voice-off compression factor the suppression module 210 applies to the PRS 208, in order to provide a safety margin and increase the likelihood that the resulting noise floor is within the specification and parameters expected by the video conferencing application.

The suppression module 210 generates a POS 212, by applying selective compression factors, based on presence or absence of a voice signal. The POS 212 is received by an output stage 216 and used to generate an output signal of the FCM 200. The output signal is transferred upstream for further processing and transmission to a far end user of the video conferencing application. The output stage 216 further provides processing to maintain a consistent noise floor at or near the ENF, while reducing or minimizing damage to the voice signal portion of the POS 212.

Figure 6:
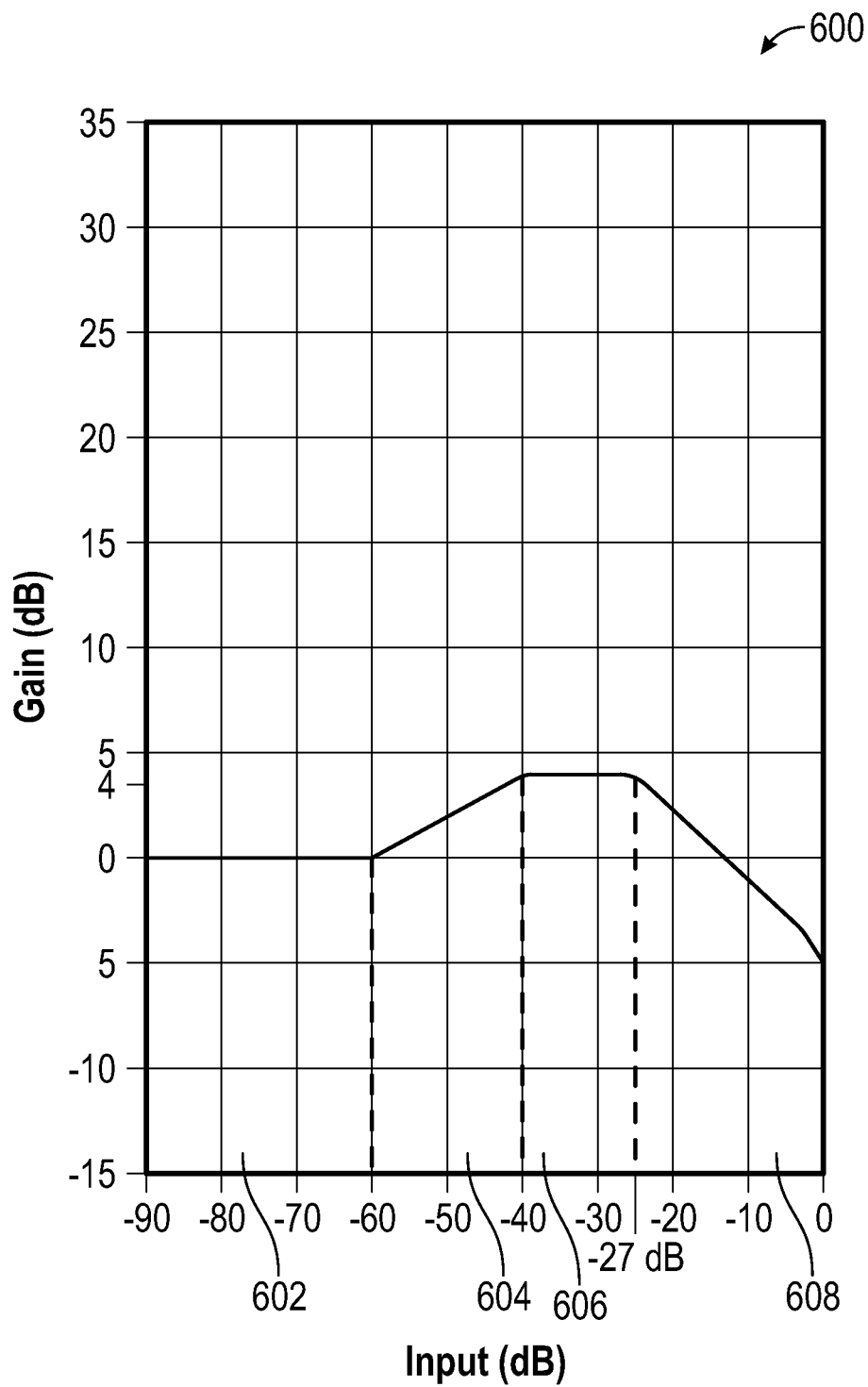
FIG. 6 illustrates an example gain graph of an output stage used in the FCM.

FIG. 6 illustrates an example gain graph 600 of the output stage 216. The output stage 216 can determine a signal level of the POS 212 and apply gains according to a gain table illustrated in the graph 600. In one implementation, the output stage 216 applies a gain to the POS 212, depending on four ranges of signal levels, including a low-level signal region 602, medium-level signal regions 604, 606 and a high-level signal region 608. These ranges are provided as examples, and persons of ordinary skill in the art can design other ranges, including fewer or more ranges, without departing from the spirit of the described technology. In some embodiments, the output stage 216 can be implemented using a dynamic range compression (DRC) module.

For the signals in the low-level signal region 602, the output stage 216 applies no gain to the POS 212. The low-level signals in the region 602 are below a threshold level at or close to the ENF. In the example shown, the POS 212 below approximately −60 dB are likely noise signals, and the output stage 216 does not amplify these signals, or only amplifies them slightly. In this example, the ENF is −65 dB. Signals in the medium-level signal regions 604 and 606 have signals with medium signal levels. Medium-level signals in the regions 604, 606 can contain voice signals. The output stage 216 can apply a gradually increasing gain factor to amplify medium level signals. In one implementation, the medium level signals can further include a low signal-to-noise ratio (SNR) region 604 and a high SNR region 606. The low SNR region 604 can include a stronger presence of noise, compared to the high SNR region 606. The high SNR region 606 is a region that most likely includes a strong voice signal and a low noise signal. In the example shown, the low SNR region 604 starts from approximately −60 dB to approximately −40 dB, and the high SNR region 606, starts from approximately −40 dB to approximately −27 dB. In some embodiments, the signals falling in the high SNR region 606 can be considered soft signals containing mostly voice signals. The output stage 216 applies a constant gain to the soft signals. In the example shown, the output stage 216 applies approximately a 4 dB gain to signals in the high SNR region 606.

The signals in a high-level signal region 608 can have high-level or loud signals. High level signals can cause clipping in a far end receiver of the video conferencing feed if they are transmitted, without modification. For portions of the POS 212 with signals falling in the high-level signal region 608, the output stage 216 can apply a gradually decreasing gain or a compression factor to prevent, minimize or reduce the likelihood of clipping in the far end. The compression factor could decrease at a linear rate, quadratic rate, exponential rate or decrease at multiple rates made of combination of these rates, depending on the loudness (signal level) of the high-level signals in the POS 212.

Figure 7:
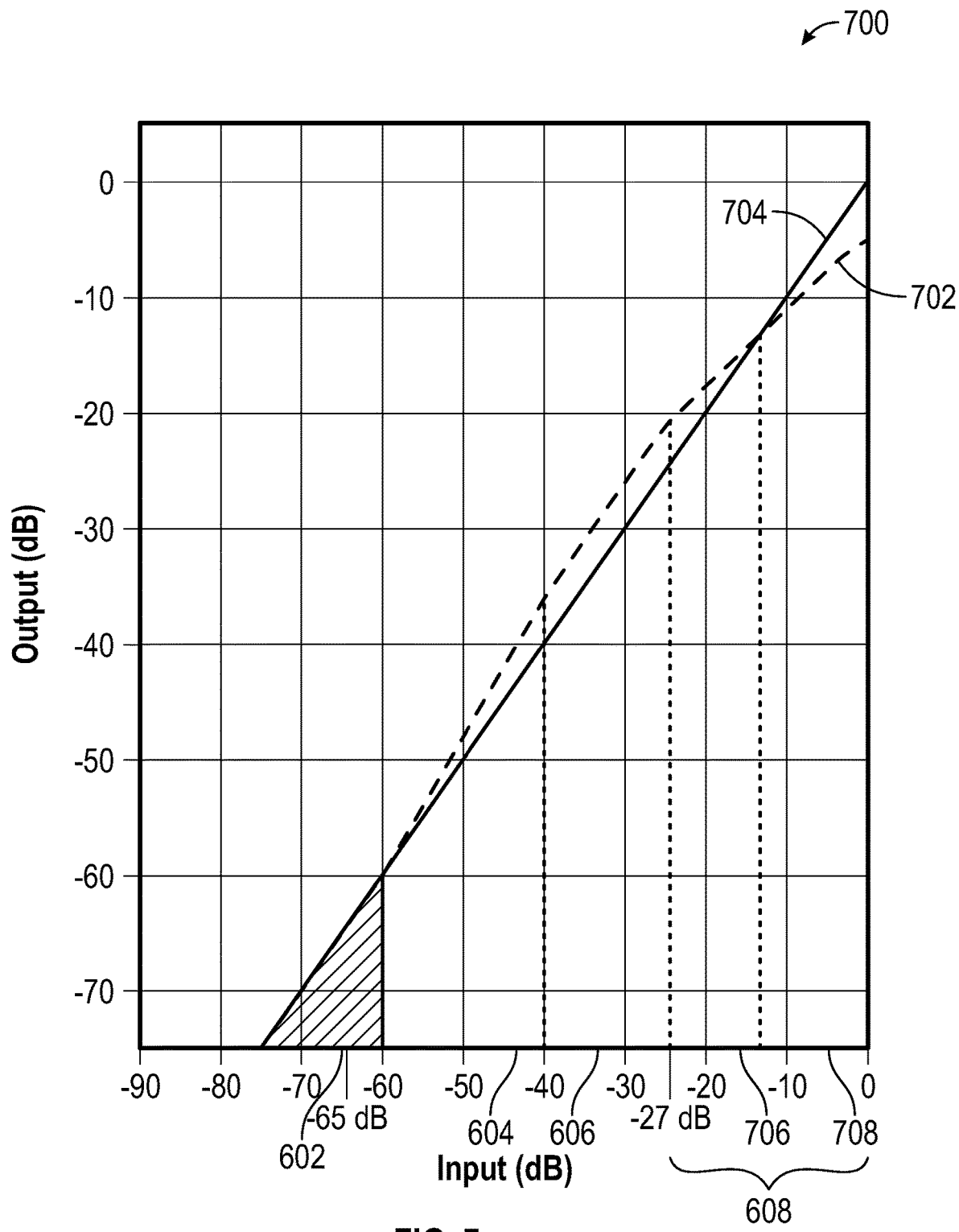
FIG. 7 illustrates an example input/output graph of the output stage.

FIG. 7 illustrates an example input/output graph 700 of the output stage 216, generated from applying the gain table illustrated in the graph 600 in FIG. 6. The graph 700 shows POS 212 input signal level values in decibel (dB) on the horizontal axis and the output of the output signal stage 216, the output signal in decibel (dB) on the vertical axis. The curve 702 plots example input signal values versus output signal values, while the line 704 illustrates input versus output if the output stage 216 were not implemented. In other words, the line 704 plots input=output values. The line 704 aids in illustrating the impact of the output stage 216 on the POS 212.

Low-level signals, below approximately −65 dB, are in the noise region, corresponding approximately to the low-level signal region 602 in the graph 600. Signals having a signal level below −60 dB are most likely noise signals and are not amplified. Consequently, the curve 702 and the line 704 are overlapping for these signals. Signals having medium signal levels, are amplified by applying a gain factor. For signals having signal levels falling in the low SNR region 604, an approximately linear gain factor is applied. Consequently, the curve 702 linearly rises in signal values above the line 704. For signals having signal levels falling in the high SNR region 606, the output stage 216 applies an approximately constant gain factor to the POS 212. Consequently, the curve 702 runs parallel to the line 704 with a vertical distance equal to the amount of the constant gain factor applied during this period. For signals falling in the high-level signal region 608, the output stage 216 applies a gradually decreasing gain factor or a compression factor to the POS 212. Consequently, the curve 702 gradually drops in signal values in the high-level signal range 608. In the example shown, the high-level signal region 608 can include a first high-level signal region 706 and a second high-level signal region 708. The first high-level signal region 706 starts from when the output stage 216 begins applying a gradually decreasing gain factor or a compression factor to the POS 212 (approximately from −27 dB in the example shown). The second high-level signal region 708 is when the curve 702 begins to drop below the line 704. For the signals in the second high-level signal region 708, the output signals drop gradually.

FIG. 8 illustrates a flowchart of a method 800 of an example operation of the FCM 200. The method starts at step 802. At step 804, an input stage 206 receives an input signal and determines the signal level of the input signal. In some embodiments, the input signal is received from an acoustic echo cancelation module (AEC) module 202, which generates the input signal by canceling an echo signal from a pre-input signal. At step 806, the input stage 216 selectively applies gains and/or compression factors to the input signal, depending on the signal level of the input signal, generating PRS 208. For example, the input stage 206 amplifies the input signal in portions having a low signal level and compresses the input signal in portions having a high signal level. In some embodiments, the input stage 206 uses a gain table to find a corresponding gain for a given signal level of an input signal.

At step 808, a suppression module 210, uses a signal from a voice activity detector 214 to selectively apply a compression factor or a suppression gain to the PRS 208 and to generate POS 212. For example, the suppression module 210 applies a voice-on compression factor when detecting a voice signal in the PRS 208 and applies a voice-off compression factor when detecting no voice signal or low voice signal in the PRS 208. In some embodiments, a noise estimation module (NEM) 204 estimates a noise level in the input signal when detecting no voice signal in the PRS 208. The VAD 214 can signal a period of no-voice to the NEM 204. The suppression module 210 can generate the voice-off compression factor, based on signal level difference between the PRS 208 and the estimated noise level generated from the NEM 204. For example, the voice-off compression factor can equal the difference between the PRS 208 and the estimated noise level in the input signal, plus the difference between the estimated noise level and an expected noise floor (ENF). In some embodiments, the suppression module 210 can generate and apply the voice-on compression factor to the PRS 208 in an amount of a predetermined buffer above the ENF.

At step 810, an output stage 216 can receive the POS 212, detect the signal level of the POS 212, and selectively apply gains and/or compression factors to the POS 212 to generate an output signal. For example, the output stage 216 can apply no gain to portions of the POS 212, determined to have low signal level. The output stage 216 can apply a gain factor to portions of the POS 212, determined to have a medium signal level. The output stage 216 can apply a compression factor to portions of the POS 212, determined to have a high signal level. The method 800 ends at step 812.

Figure 9:
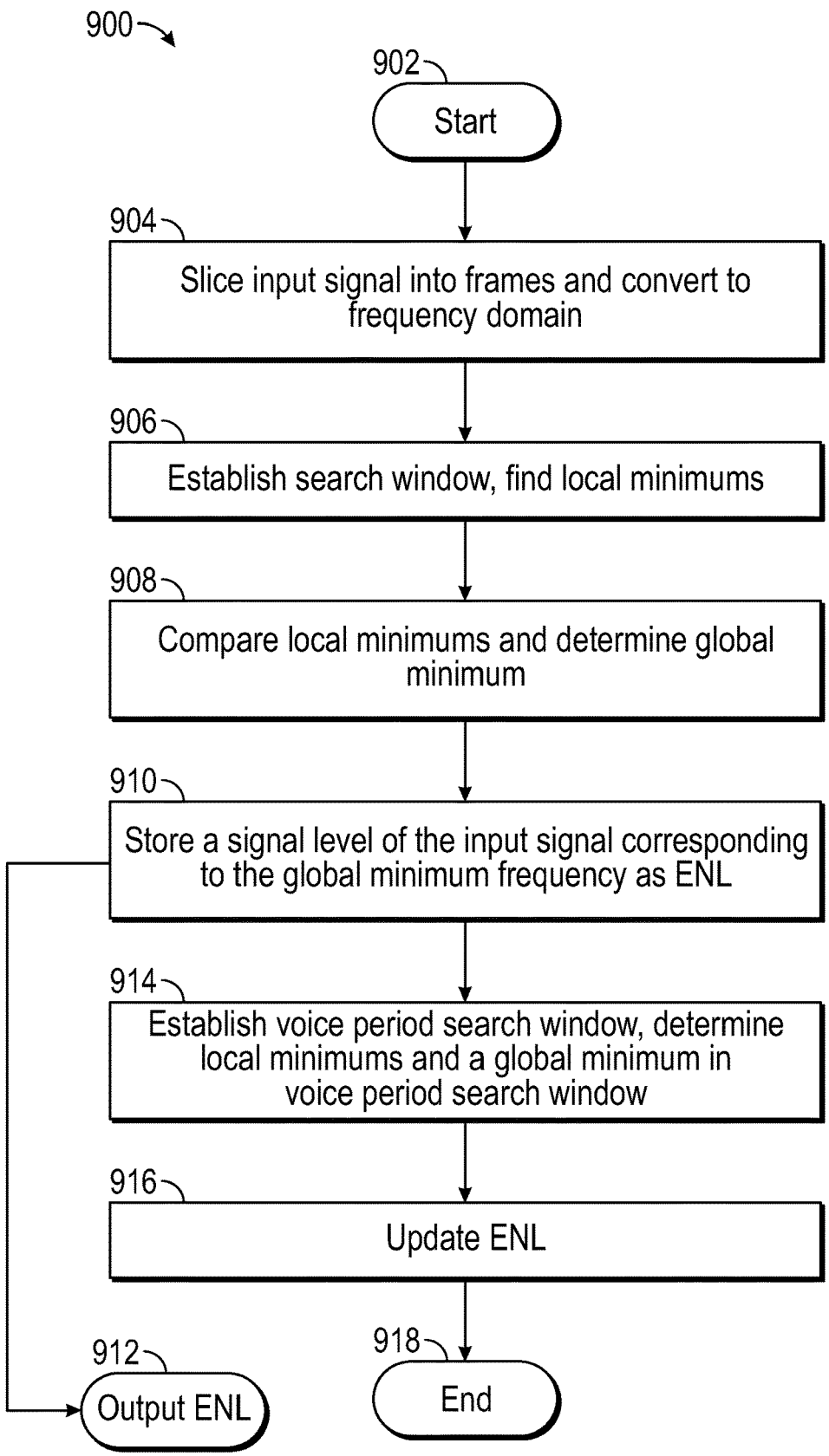
FIG. 9 illustrates a flowchart of a method of an example operation of estimating noise in the FCM.

FIG. 9 illustrates a flowchart of a method 900 of an example operation of estimating noise in the FCM 200. The method starts at step 902. At step 904, a slicing module 508 slices the input signal 502 into frames, and a frequency conversion module 510 converts each frame into a frequency domain frame. At step 906, a minimum tracking module 512 establishes a search window when detecting a silent period. The silent period can be indicated by a signal from the VAD 214. The search window can include a number of frequency domain frames. The minimum tracking module 512 can search for and store local minimum frequencies in each frequency domain frame in the search window. At step 908, the minimum tracking module 512 determines a global minimum frequency in the search window by comparing the local minimum frequencies in each frequency domain frame with one another. At step 910, the global minimum frequency can be stored and a corresponding signal level of the input signal having the global minimum frequency can be stored as an estimated noise level (ENL) in the input signal. In some embodiments, the method 900 can end at step 912 by outputting the stored ENL.

In some embodiments, the minimum tracking module 512 can update the global minimum frequency and the ENL, based on establishing both a silent period search window and a voice-period search window. In those embodiments, the search window outlined above in steps 906-910 can be termed a silent period search window. At step, 914, the minimum tracking module 512 can establish a voice period search window from the frequency domain frames of a voice period. The minimum tracking module 512 can determine local minimum frequencies in frequency domain frames in the voice period search window and determine a global minimum frequency in the voice period search window, by comparing the determined local minimum frequencies in each frequency domain with one another. At step 916, the minimum tracking module 512 can update the estimated noise level (ENL) in the input signal to a signal level corresponding to the global minimum frequency in the voice period search window if the global minimum frequency in the voice period search window is less than the global minimum frequency in the silent period search window. The method ends at the step 918.

Example Implementation Mechanism Hardware Overview

Some embodiments are implemented by a computer system or a network of computer systems. A computer system may include a processor, a memory, and a non-transitory computer-readable medium. The memory and non-transitory medium may store instructions for performing methods, steps and techniques described herein.

According to one embodiment, the techniques described herein are implemented by one or more special-purpose computing devices. The special-purpose computing devices may be hard-wired to perform the techniques or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be server computers, cloud computing computers, desktop computer systems, portable computer systems, handheld devices, networking devices or any other device that incorporates hard-wired and/or program logic to implement the techniques.

Figure 10:
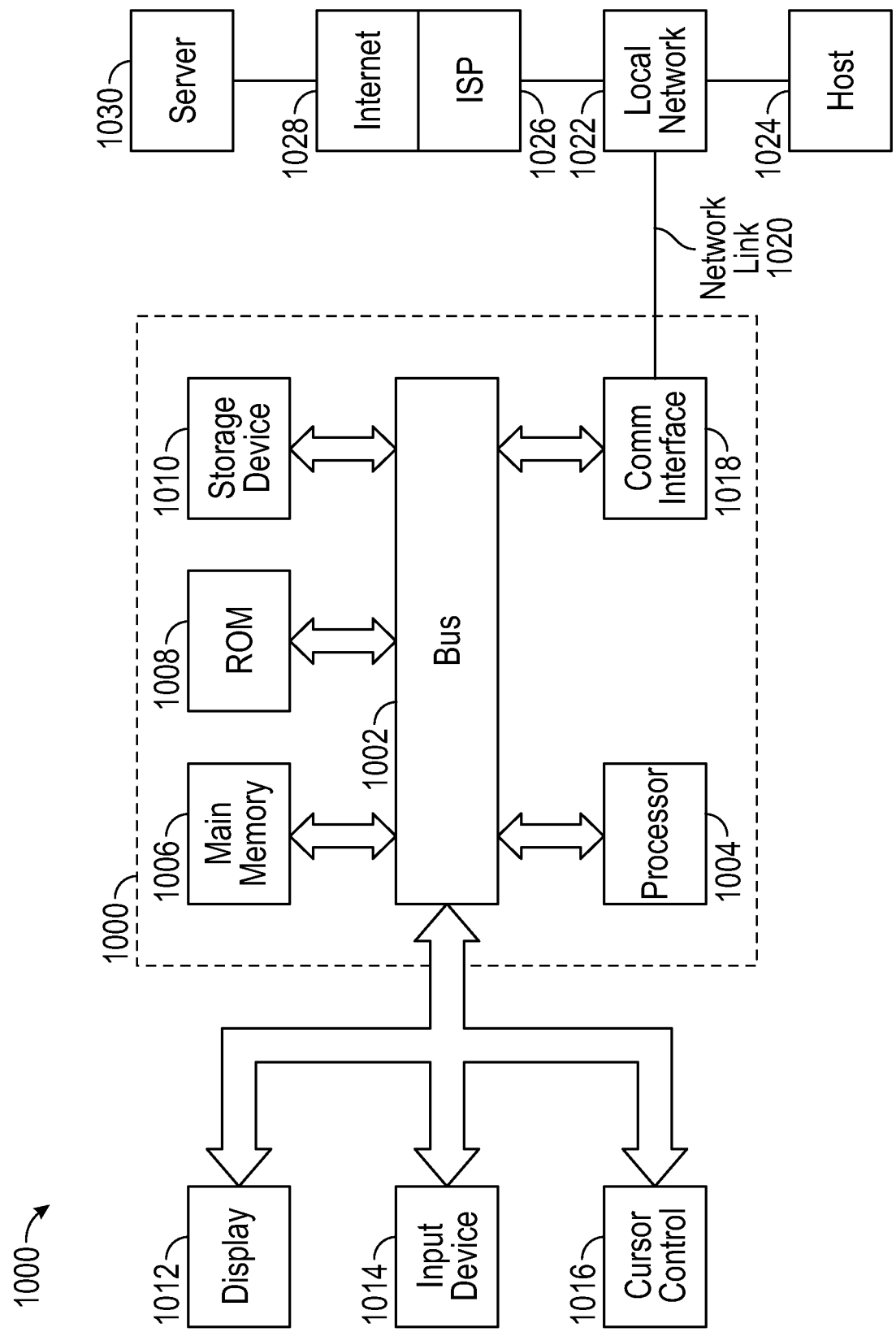
FIG. 10 is a block diagram that illustrates a computer system upon which an embodiment of can be implemented.

For example, FIG. 10 is a block diagram that illustrates a computer system 1000 upon which an embodiment of can be implemented. Computer system 1000 includes a bus 1002 or other communication mechanism for communicating information, and a hardware processor 1004 coupled with bus 1002 for processing information. Hardware processor 1004 may be, for example, special-purpose microprocessor optimized for handling audio and video streams generated, transmitted or received in video conferencing architectures.

Computer system 1000 also includes a main memory 1006, such as a random access memory (RAM) or other dynamic storage device, coupled to bus 1002 for storing information and instructions to be executed by processor 1004. Main memory 1006 also may be used for storing temporary variables or other intermediate information during execution of instructions to be executed by processor 1004. Such instructions, when stored in non-transitory storage media accessible to processor 1004, render computer system 1000 into a special-purpose machine that is customized to perform the operations specified in the instructions.

Computer system 1000 further includes a read only memory (ROM) 1008 or other static storage device coupled to bus 1002 for storing static information and instructions for processor 1004. A storage device 1010, such as a magnetic disk, optical disk, or solid state disk is provided and coupled to bus 1002 for storing information and instructions.

Computer system 1000 may be coupled via bus 1002 to a display 1012, such as a cathode ray tube (CRT), liquid crystal display (LCD), organic light-emitting diode (OLED), or a touchscreen for displaying information to a computer user. An input device 1014, including alphanumeric and other keys (e.g., in a touch screen display) is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane. In some embodiments, the user input device 1014 and/or the cursor control 1016 can be implemented in the display 1012 for example, via a touchscreen interface that serves as both output display and input device.

Computer system 1000 may implement the techniques described herein using customized hard-wired logic, one or more ASICs or FPGAs, firmware and/or program logic which in combination with the computer system causes or programs computer system 1000 to be a special-purpose machine. According to one embodiment, the techniques herein are performed by computer system 1000 in response to processor 1004 executing one or more sequences of one or more instructions contained in main memory 1006. Such instructions may be read into main memory 1006 from another storage medium, such as storage device 1010. Execution of the sequences of instructions contained in main memory 1006 causes processor 1004 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical, magnetic, and/or solid-state disks, such as storage device 1010. Volatile media includes dynamic memory, such as main memory 1006. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1002. Transmission media can also take the form of acoustic or light waves, such as those generated during radio-wave and infra-red data communications.

Various forms of media may be involved in carrying one or more sequences of one or more instructions to processor 1004 for execution. For example, the instructions may initially be carried on a magnetic disk or solid state drive of a remote computer. The remote computer can load the instructions into its dynamic memory and send the instructions over a telephone line using a modem. A modem local to computer system 1000 can receive the data on the telephone line and use an infra-red transmitter to convert the data to an infra-red signal. An infra-red detector can receive the data carried in the infra-red signal and appropriate circuitry can place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also includes a communication interface 1018 coupled to bus 1002. Communication interface 1018 provides a two-way data communication coupling to a network link 1020 that is connected to a local network 1022. For example, communication interface 1018 may be an integrated services digital network (ISDN) card, cable modem, satellite modem, or a modem to provide a data communication connection to a corresponding type of telephone line. As another example, communication interface 1018 may be a local area network (LAN) card to provide a data communication connection to a compatible LAN. Wireless links may also be implemented. In any such implementation, communication interface 1018 sends and receives electrical, electromagnetic or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the worldwide packet data communication network now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are example forms of transmission media.

Computer system 1000 can send messages and receive data, including program code, through the network(s), network link 1020 and communication interface 1018. In the Internet example, a server 1030 might transmit a requested code for an application program through Internet 1028, ISP 1026, local network 1022 and communication interface 1018. The received code may be executed by processor 1004 as it is received, and/or stored in storage device 1010, or other non-volatile storage for later execution.

EXAMPLES

It will be appreciated that the present disclosure may include any one and up to all of the following examples.

Example 1: A method comprising: receiving an input signal; determining a signal level of the input signal; generating a pre-suppression signal, by amplifying the input signal in portions having a low signal level and compressing the input signal in portions having a high signal level; generating a post-suppression signal, by applying a voice-on compression factor when detecting a voice signal in the pre-suppression signal, and by applying a voice-off compression factor when detecting no voice signal in the pre-suppression signal; and generating an output signal from the post-suppression signal by: applying no gain to portions of post-suppression signal having a low signal level; applying a gain factor to portions of post-suppression signal having a medium signal level.

Example 2: The method of Example 1, further comprising: estimating a noise level in the input signal, when detecting no voice signal in the pre-suppression signal; generating the voice-off compression factor, based on signal level difference between the pre-suppression signal during a voice off period and the estimated noise level; and applying the voice-off compression factor to the pre-suppression signal, during voice off period.

Example 3: The method of some or all of Examples 1-2, further comprising: estimating a noise level in the input signal, when detecting no voice signal in the pre-suppression signal; generating the voice-off compression factor, wherein the voice-off compression factor comprises difference between the pre-suppression signal during a voice off period and the estimated noise level, plus difference between the estimated noise level and an expected noise floor; and applying the voice-off compression factor to the pre-suppression signal, during voice off period.

Example 4: The method of some or all of Examples 1-3, wherein the voice-on compression factor is an amount of a predetermined buffer above an expected noise floor.

Example 5: The method of some or all of Examples 1-4, further comprising: slicing the input signal into frames; converting each frame to frequency domain, generating a plurality of frequency domain frames; detecting a silent period; establishing a search window, comprising a portion of the plurality of the frequency domain frames; determining local minimum frequencies in the frequency domain frames in the search window; determining a global minimum frequency in the search window; estimating a noise level in the input signal based on a signal level corresponding to the determined global minimum frequency in the search window; generating the voice-off compression factor, based on signal level difference between the pre-suppression signal during the silent period and the estimated noise level; and applying the voice-off compression factor to the pre-suppression signal, during the silent period.

Example 6: The method of some or all of Examples 1-5, further comprising: slicing the input signal into frames; converting each frame to the frequency domain, generating a plurality of frequency domain frames; detecting a silent period and a voice period; establishing a silent period search window comprising portions of the plurality of the frequency domain frames corresponding to the silent period; establishing a voice period search window comprising portions of the plurality of the frequency domain frames corresponding to the voice period; determining local minimum frequencies in frequency domain frames in the silent period search window; determining a global minimum frequency in the silent period search window; estimating a noise level in the input signal based on a signal level corresponding to the determined global minimum frequency in the silent search window; determining local minimum frequencies in frequency domain frames in the voice period search window; determining a global minimum frequency in the voice period search window; updating the estimated noise level in the input signal to a signal level corresponding to the global minimum frequency in the voice period search window, when the global minimum frequency in the voice period search window is less than the global minimum frequency in the silent period search window; generating the voice-off compression factor, based on signal level difference between the pre-suppression signal during the silent period and the estimated noise level; and applying the voice-off compression factor to the pre-suppression signal, during the silent period.

Example 7: The method of some or all of Examples 1-6, further comprising: generating the output signal by applying a compression factor to portions of the post-suppression signal having a high signal level.

Example 8: The non-transitory computer storage that stores executable program instructions that, when executed by one or more computing devices, configure the one or more computing devices to perform operations comprising: receiving an input signal; determining a signal level of the input signal; generating a pre-suppression signal, by amplifying the input signal in portions having a low signal level and compressing the input signal in portions having a high signal level; generating a post-suppression signal, by applying a voice-on compression factor when detecting a voice signal in the pre-suppression signal, and by applying a voice-off compression factor when detecting no voice signal in the pre-suppression signal; and generating an output signal from the post-suppression signal by: applying no gain to portions of post-suppression signal having a low signal level; applying a gain factor to portions of post-suppression signal having a medium signal level.

Example 9: The non-transitory computer storage of Example 8, wherein the operations further comprise: estimating a noise level in the input signal, when detecting no voice signal in the pre-suppression signal; generating the voice-off compression factor, based on signal level difference between the pre-suppression signal during a voice off period and the estimated noise level; and applying the voice-off compression factor to the pre-suppression signal, during voice off period.

Example 10: The non-transitory computer storage of some or all of Examples 8-9, wherein the operations further comprise: estimating a noise level in the input signal, when detecting no voice signal in the pre-suppression signal; generating the voice-off compression factor, wherein the voice-off compression factor comprises difference between the pre-suppression signal during a voice off period and the estimated noise level, plus difference between the estimated noise level and an expected noise floor; and applying the voice-off compression factor to the pre-suppression signal, during voice off period.

Example 11: The non-transitory computer storage of Examples some or all of 8-10, wherein the voice-on compression factor is an amount of a predetermined buffer above an expected noise floor.

Example 12: The non-transitory computer storage of some or all of Examples 8-11, wherein the operations further comprise: slicing the input signal into frames; converting each frame to frequency domain, generating a plurality of frequency domain frames; detecting a silent period; establishing a search window, comprising a portion of the plurality of the frequency domain frames; determining local minimum frequencies in the frequency domain frames in the search window; determining a global minimum frequency in the search window; estimating a noise level in the input signal based on a signal level corresponding to the determined global minimum frequency in the search window; generating the voice-off compression factor, based on signal level difference between the pre-suppression signal during the silent period and the estimated noise level; and applying the voice-off compression factor to the pre-suppression signal, during the silent period.

Example 13: The non-transitory computer storage of some or all of Examples 8-12, wherein the operations further comprise: slicing the input signal into frames; converting each frame to the frequency domain, generating a plurality of frequency domain frames; detecting a silent period and a voice period; establishing a silent period search window comprising portions of the plurality of the frequency domain frames corresponding to the silent period; establishing a voice period search window comprising portions of the plurality of the frequency domain frames corresponding to the voice period; determining local minimum frequencies in frequency domain frames in the silent period search window; determining a global minimum frequency in the silent period search window; estimating a noise level in the input signal based on a signal level corresponding to the determined global minimum frequency in the silent search window; determining local minimum frequencies in frequency domain frames in the voice period search window; determining a global minimum frequency in the voice period search window; updating the estimated noise level in the input signal to a signal level corresponding to the global minimum frequency in the voice period search window, when the global minimum frequency in the voice period search window is less than the global minimum frequency in the silent period search window; generating the voice-off compression factor, based on signal level difference between the pre-suppression signal during the silent period and the estimated noise level; and applying the voice-off compression factor to the pre-suppression signal, during the silent period.

Example 14: The non-transitory computer storage of some or all of Examples 8-13, wherein the operations further comprise: generating the output signal by applying a compression factor to portions of the post-suppression signal having a high signal level.

Example 15: The non-transitory computer storage of some or all of Examples 8-14, wherein the operations further comprise: receiving a pre-input signal; and generating the input signal by canceling an echo signal in the pre-input signal.

Example 16: A system comprising: an input stage configured to receive an input signal, determine a signal level of the input signal and generate a pre-suppression signal, by amplifying the input signal in portions having a low signal level and compressing the input signal in portions having a high signal level; a suppression module configured to generate a post-suppression signal, by applying a voice-on compression factor when detecting a voice signal in the pre-suppression signal, and by applying a voice-off compression factor when detecting no voice signal in the pre-suppression signal; and an output stage configured to generate an output signal from the post-suppression signal by: applying no gain to portions of post-suppression signal having a low signal level; applying a gain factor to portions of post-suppression signal having a medium signal level.

Example 17: The system of Example 16, further comprising: a voice activity detection module configured to detect the voice signal in the pre-suppression signal.

Example 18: The system of some or all of Examples 16-17, further comprising: a voice activity detection module, configured to detect the voice signal in the pre-suppression signal; and a noise estimation module configured to estimate a noise level in the input signal, when the voice activity detection module detects no voice signal in the pre-suppression signal, wherein the suppression module is configured to generate the voice-off compression factor, based on signal level difference between the pre-suppression signal during a voice off period and the estimated noise level; and the suppression module is further configured to apply the voice-off compression factor to the pre-suppression signal, during the voice off period.

Example 19: The system of some or all of Examples 16-18, further comprising: a voice activity detection module configured to detect a silent period in the pre-suppression signal; and a noise estimation module configured to perform operations comprising: slicing the input signal into frames; converting each frame to the frequency domain, generating a plurality of frequency domain frames; establishing a search window, comprising a portion of the plurality of the frequency domain frames; determining local minimum frequencies in each frequency domain frame in the search window; determining a global minimum frequency in the search window; estimating a noise level in the input signal based on a signal level corresponding to the determined global minimum frequency in the search window, wherein the noise suppression module is configured to generate the voice-off compression factor, based on signal level difference between the pre-suppression signal during the silent period and the estimated noise level; and the noise suppression module is further configured to apply the voice-off compression factor to the pre-suppression signal, during the silent period.

Example 20: The system of some or all of Examples 16-19, further comprising: a voice activity detection module configured to detect a silent period in the pre-suppression signal; and a noise estimation module configured to perform operations comprising: slicing the input signal into frames; converting each frame to the frequency domain, generating a plurality of frequency domain frames; detecting a silent period and a voice period; establishing a silent period search window comprising portions of the plurality of the frequency domain frames corresponding to the silent period; establishing a voice period search window comprising portions of the plurality of the frequency domain frames corresponding to the voice period; determining local minimum frequencies in frequency domain frames in the silent period search window; determining a global minimum frequency in the silent period search window; estimating a noise level in the input signal based on a signal level corresponding to the determined global minimum frequency in the silent search window; determining local minimum frequencies in frequency domain frames in the voice period search window; determining a global minimum frequency in the voice period search window; updating the estimated noise level in the input signal to a signal level corresponding to the global minimum frequency in the voice period search window, when the global minimum frequency in the voice period search window is less than the global minimum frequency in the silent period search window, wherein the suppression module is configured to generate the voice-off compression factor, based on signal level difference between the pre-suppression signal during the silent period and the estimated noise level; and the noise suppression module is further configured to apply the voice-off compression factor to the pre-suppression signal, during the silent period.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying" or "determining" or "executing" or "performing" or "collecting" or "creating" or "sending" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

Various general purpose systems may be used with programs in accordance with the teachings herein, or it may prove convenient to construct a more specialized apparatus to perform the method. The structure for a variety of these systems will appear as set forth in the description above. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

While the invention has been particularly shown and described with reference to specific embodiments thereof, it should be understood that changes in the form and details of the disclosed embodiments may be made without departing from the scope of the invention. Although various advantages, aspects, and objects of the present invention have been discussed herein with reference to various embodiments, it will be understood that the scope of the invention should not be limited by reference to such advantages, aspects, and objects. Rather, the scope of the invention should be determined with reference to patent claims.

What is claimed is:

1. A method comprising:
receiving an input signal;
determining a signal level of the input signal;
estimating a noise level in the input signal based on a global minimum frequency in a first search window, comprising:
converting one or more time domain frames to the frequency domain, each converted time domain frame comprising a plurality of frequency domain frames;
establishing the first search window, comprising one or more frequency domain frames;
determining a local minimum frequency in each frequency domain frame in the first search window; and
determining the global minimum frequency for the first search window from the local minimum frequencies in the first search window;
generating a pre-suppression signal, by amplifying the input signal in portions having a low input signal level and compressing the input signal in portions having a high input signal level, the low input signal level being below an input signal low-level threshold and the high input signal level being above an input signal high-level threshold;
generating a post-suppression signal, by applying a voice-on compression factor when detecting a voice signal in the pre-suppression signal, and by applying a voice-off compression factor when detecting no voice signal in the pre-suppression signal; and
generating an output signal from the post-suppression signal by:
applying no gain to portions of post-suppression signal having a low post-suppression signal level being below a low post-suppression level threshold; and
applying a gain factor to portions of post-suppression signal having a medium post-suppression signal level being above the low post-suppression level threshold used to determine the low post-suppression signal level.

2. The method of claim 1, further comprising:
estimating the noise level in the input signal responsive to detecting no voice signal in the pre-suppression signal;
generating the voice-off compression factor, based on a signal level difference between the pre-suppression signal during a voice off period and the estimated noise level; and
applying the voice-off compression factor to the pre-suppression signal, during the voice off period.

3. The method of claim 1 further comprising:
estimating the noise level in the input signal responsive to detecting no voice signal in the pre-suppression signal;
generating the voice-off compression factor, wherein the voice-off compression factor comprises a difference between the pre-suppression signal during a voice off period and the estimated noise level, plus a difference between the estimated noise level and an expected noise floor; and
applying the voice-off compression factor to the pre-suppression signal, during voice off period.

4. The method of claim 1, wherein the voice-on compression factor is an amount of a predetermined buffer above an expected noise floor.

5. The method of claim 1, wherein the first search window corresponds to a silent period characterized by no detected voice signal in the input signal, and further comprising:
generating the voice-off compression factor, based on signal level difference between the pre-suppression signal during the silent period and the estimated noise level; and
applying the voice-off compression factor to the pre-suppression signal, during the silent period.

6. The method of claim 5, wherein a second search window corresponds to a voice period characterized by a detected voice signal in the input signal, and further comprising:
establishing the second search window comprising one or more frequency domain frames;
determining a local minimum frequency in each frequency domain frame in the second search window;
determining a global minimum frequency in the second search window from the local minimum frequencies in the second search window; and
updating the estimated noise level in the input signal to a signal level corresponding to the global minimum frequency in the second search window, when the global minimum frequency in the second search window is less than the global minimum frequency in the first search window.

7. The method of claim 1, further comprising:
generating the output signal by applying a compression factor to portions of the post-suppression signal having a high post-suppression signal level being above a high post-suppression level threshold.

8. Non-transitory computer storage that stores executable program instructions that, when executed by one or more computing devices, configure the one or more computing devices to perform operations comprising:
receiving an input signal;
determining a signal level of the input signal;
estimating a noise level in the input signal based on a global minimum frequency in a first search window, comprising:
converting one or more time domain frames to the frequency domain, each converted time domain frame comprising a plurality of frequency domain frames;
establishing the first search window, comprising one or more frequency domain frames;
determining a local minimum frequency in each frequency domain frame in the first search window; and
determining the global minimum frequency for the first search window from the local minimum frequencies in the first search window;
generating a pre-suppression signal, by amplifying the input signal in portions having a low input signal level and compressing the input signal in portions having a high input signal level, the low input signal level being below an input signal low-level threshold and the high input signal level being above an input signal high-level threshold;
generating a post-suppression signal, by applying a voice-on compression factor when detecting a voice signal in the pre-suppression signal, and by applying a voice-off compression factor when detecting no voice signal in the pre-suppression signal; and
generating an output signal from the post-suppression signal by:
applying no gain to portions of post-suppression signal having a low post-suppression signal level being below a low post-suppression level threshold; and
applying a gain factor to portions of post-suppression signal having a medium post-suppression signal level being above the low post-suppression level threshold used to determine the low post-suppression signal level.

9. The non-transitory computer storage of claim 8, wherein the operations further comprise:
estimating the noise level in the input signal responsive to detecting no voice signal in the pre-suppression signal;
generating the voice-off compression factor, based on a signal level difference between the pre-suppression signal during a voice off period and the estimated noise level; and
applying the voice-off compression factor to the pre-suppression signal, during the voice off period.

10. The non-transitory computer storage of claim 8, wherein the operations further comprise:
estimating the noise level in the input signal responsive to detecting no voice signal in the pre-suppression signal;
generating the voice-off compression factor, wherein the voice-off compression factor comprises difference between the pre-suppression signal during a voice off period and the estimated noise level, plus a difference between the estimated noise level and an expected noise floor; and
applying the voice-off compression factor to the pre-suppression signal, during voice off period.

11. The non-transitory computer storage of claim 8, wherein the voice-on compression factor is an amount of a predetermined buffer above an expected noise floor.

12. The non-transitory computer storage of claim 8, wherein the first search window corresponds to a silent period characterized by no detected voice signal in the input signal and the operations further comprise:
generating the voice-off compression factor, based on signal level difference between the pre-suppression signal during the silent period and the estimated noise level; and
applying the voice-off compression factor to the pre-suppression signal, during the silent period.

13. The non-transitory computer storage of claim 12, wherein a second search window corresponds to a voice period characterized by a detected voice signal in the input signal and the operations further comprise:
establishing the second search window comprising one or more frequency domain frames;
determining a local minimum frequency in each frequency domain frame in the second search window;
determining a global minimum frequency in the second search window from the local minimum frequencies in the second search window; and
updating the estimated noise level in the input signal to a signal level corresponding to the global minimum frequency in the second search window, when the global minimum frequency in the second search window is less than the global minimum frequency in the first search window.

14. The non-transitory computer storage of claim 8, wherein the operations further comprise:
generating the output signal by applying a compression factor to portions of the post-suppression signal having a high post-suppression signal level being above a high post-suppression level threshold.

15. The non-transitory computer storage of claim 8, wherein the operations further comprise:
receiving a pre-input signal; and
generating the input signal by canceling an echo signal in the pre-input signal.

16. A system comprising:
an input stage configured to receive an input signal, determine a signal level of the input signal and generate a pre-suppression signal, by amplifying the input signal in portions having a low input signal level and compressing the input signal in portions having a high input signal level, the low input signal level being below an input signal low-level threshold and the high input signal level being above an input signal high-level threshold;
a noise estimation module configured to estimate a noise level in the input signal by determining a global minimum frequency from among one or more local minimum frequencies corresponding to one or more frequency domain frames of a first search window, each of which is converted from the time domain to the frequency domain, and determining an estimated noise level in the input signal based on a signal level corresponding to the determined global minimum frequency in the first search window;
a suppression module configured to generate a post-suppression signal, by applying a voice-on compression factor when detecting a voice signal in the pre-suppression signal, and by applying a voice-off compression factor when detecting no voice signal in the pre-suppression signal; and
an output stage configured to generate an output signal from the post-suppression signal by:
applying no gain to portions of post-suppression signal having a low post-suppression signal level being below a low post-suppression level threshold; and
applying a gain factor to portions of post-suppression signal having a medium post-suppression signal level being above the low post-suppression level threshold used to determine the low post-suppression signal level.

17. The system of claim 16 further comprising a voice activity detection module configured to detect the voice signal in the pre-suppression signal.

18. The system of claim 16 further comprising:
a voice activity detection module, configured to detect the voice signal in the pre-suppression signal, wherein
the noise estimation module is further configured to estimate the noise level in the input signal responsive to the voice activity detection module detecting no voice signal in the pre-suppression signal; and
the suppression module is further configured to:
generate the voice-off compression factor, based on a signal level difference between the pre-suppression signal during a voice off period and the estimated noise level; and
apply the voice-off compression factor to the pre-suppression signal, during the voice off period.

19. The system of claim 16, wherein the first search window corresponds to a silent period characterized by no detected voice signal in the input signal by a voice activity detection module
and the suppression module is further configured to:
generate the voice-off compression factor, based on signal level difference between the pre-suppression signal during the silent period and the estimated noise level; and
apply the voice-off compression factor to the pre-suppression signal, during the silent period.

20. The system of claim 19, wherein:
a second search window corresponds to a voice period characterized by a detected voice signal in the input signal by the voice activity detection module; and
the suppression module is further configured to:
establish the second search window comprising one or more frequency domain frames;
determine a local minimum frequency in each frequency domain frame in the second search window;
determine a global minimum frequency in the second search window from the local minimum frequencies in the second search window; and
update the estimated noise level in the input signal to a signal level corresponding to the global minimum frequency in the second search window, when the global minimum frequency in the second search window is less than the global minimum frequency in the first search window.

\* \* \* \* \*